(12) United States Patent
Morianz et al.

(10) Patent No.: US 11,058,004 B2
(45) Date of Patent: Jul. 6, 2021

(54) METALLIC LAYER AS CARRIER FOR COMPONENT EMBEDDED IN CAVITY OF COMPONENT CARRIER

(71) Applicant: AT&S Austria Technologie & Systemtechnik Aktiengesellschaft, Leoben (AT)

(72) Inventors: Mike Morianz, Graz (AT); Christian Galler, Leoben (AT); Gerhard Stubenberger, Trofaiach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/259,239

(22) Filed: Jan. 28, 2019

(65) Prior Publication Data
US 2019/0246501 A1    Aug. 8, 2019

(30) Foreign Application Priority Data

Feb. 5, 2018   (EP) .................................... 18155181

(51) Int. Cl.
| | |
|---|---|
| *H05K 1/18* | (2006.01) |
| *H05K 3/46* | (2006.01) |
| *H01L 23/538* | (2006.01) |
| *H01L 23/13* | (2006.01) |
| *H01L 23/31* | (2006.01) |
| *H05K 1/05* | (2006.01) |
| *H05K 3/30* | (2006.01) |
| *H05K 3/00* | (2006.01) |

(52) U.S. Cl.
CPC ............. *H05K 1/183* (2013.01); *H01L 23/13* (2013.01); *H01L 23/3114* (2013.01); *H01L 23/3121* (2013.01); *H01L 23/5389* (2013.01); *H05K 1/053* (2013.01); *H05K 1/185* (2013.01); *H05K 3/301* (2013.01); *H05K 3/4697* (2013.01); *H01L 2224/04105* (2013.01); *H01L 2224/06181* (2013.01); *H01L 2224/18* (2013.01); *H01L 2224/73267* (2013.01); *H01L 2224/8203* (2013.01); *H01L 2224/9222* (2013.01); *H05K 3/0035* (2013.01); *H05K 2203/1469* (2013.01)

(58) Field of Classification Search
CPC ........ H05K 1/183; H05K 1/053; H05K 1/185; H01L 23/142
USPC ................................ 29/832, 829, 825, 592.1
See application file for complete search history.

(56) References Cited

U.S. PATENT DOCUMENTS

| | | | | |
|---|---|---|---|---|
| 5,234,105 | A * | 8/1993 | Sato ......................... | B65B 69/00 206/213.1 |
| 7,930,819 | B2 * | 4/2011 | Yonemitsu ......... | H05K 13/0417 29/739 |
| 2006/0014327 | A1 * | 1/2006 | Cho ........................ | H05K 1/186 438/125 |

(Continued)

*Primary Examiner* — Peter Dungba Vo
*Assistant Examiner* — Azm A Parvez
(74) *Attorney, Agent, or Firm* — Robert A. Blaha; Smith Tempel Blaha LLC

(57) ABSTRACT

A method of manufacturing a component carrier is presented. The method includes providing a base structure having a front side and a back side, the back side being at least partially covered by a metallic layer, removing material of the base structure from the front side to thereby form a cavity which is at least partially closed by the metallic layer, inserting a component in the cavity and placing the component on the metallic layer.

12 Claims, 2 Drawing Sheets

(56) References Cited

U.S. PATENT DOCUMENTS

| | | |
|---|---|---|
| 2009/0188703 A1 | 7/2009 | Ito et al. |
| 2009/0301766 A1 | 12/2009 | Park et al. |
| 2012/0273941 A1 | 11/2012 | Zeng |
| 2013/0069489 A1* | 3/2013 | Mizusawa ............... H03H 9/17 310/348 |
| 2013/0299223 A1* | 11/2013 | Yoo ....................... H05K 1/02 174/259 |
| 2014/0070396 A1 | 3/2014 | Kyozuka et al. |
| 2014/0144676 A1* | 5/2014 | Chung .................. H05K 1/186 174/251 |

* cited by examiner

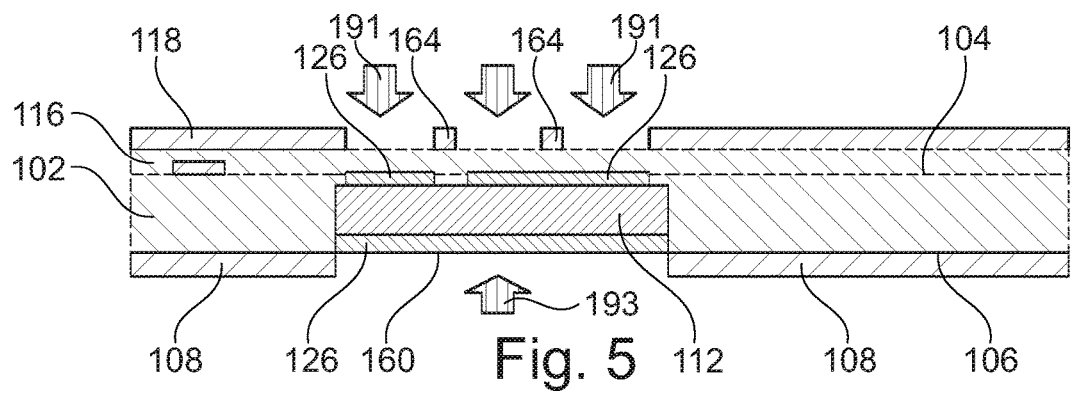
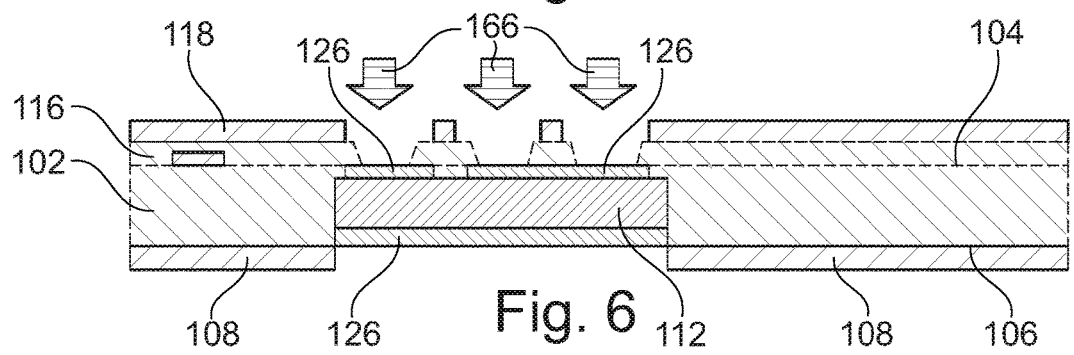
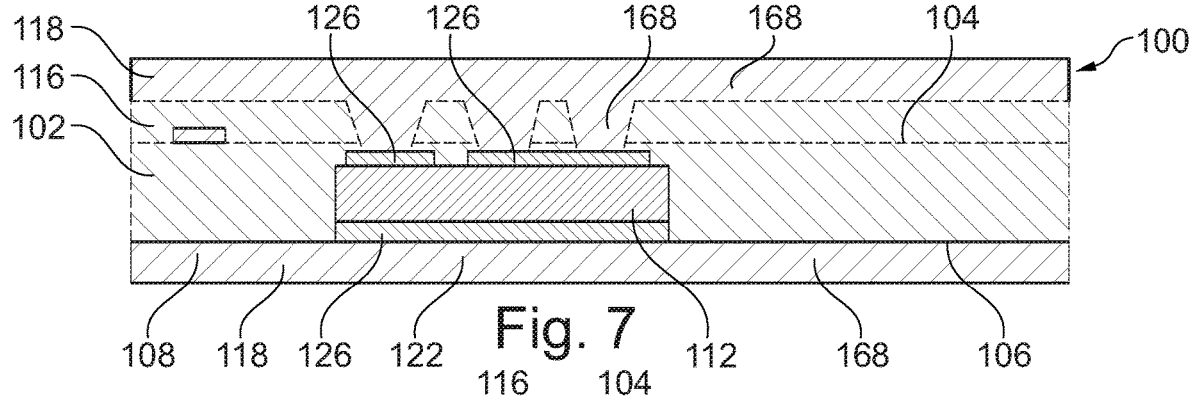
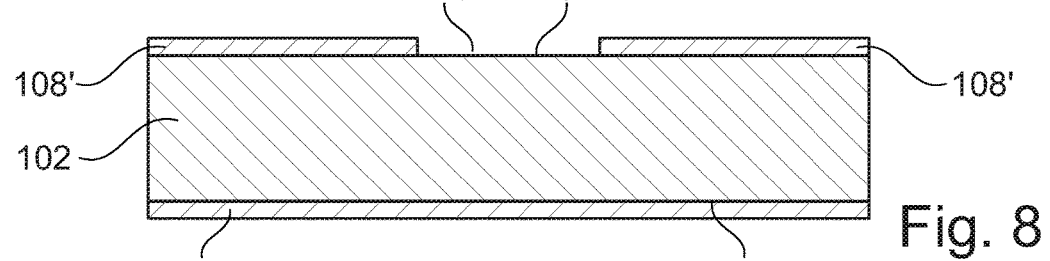
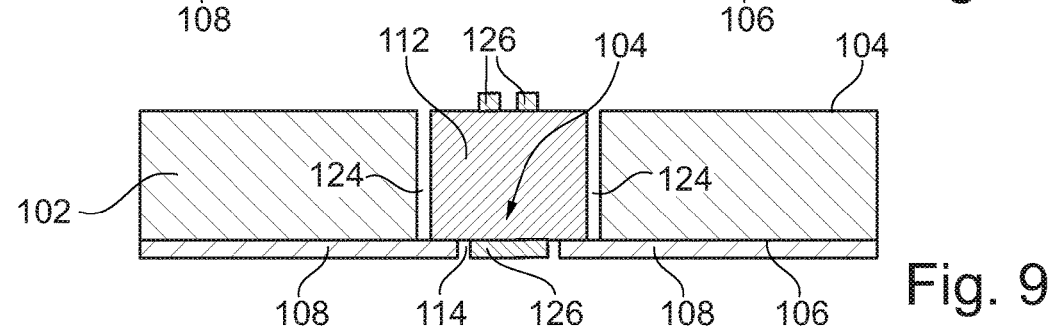

METALLIC LAYER AS CARRIER FOR COMPONENT EMBEDDED IN CAVITY OF COMPONENT CARRIER

CROSS-REFERENCE TO RELATED APPLICATIONS

This application claims priority to European Patent Application No. 18 155 181.3, filed 5 Feb. 2018, the disclosure of which is hereby incorporated herein by reference in its entirety.

TECHNICAL FIELD

The invention relates to a method of manufacturing a component carrier and to a component carrier.

Technological Background

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Moreover, efficiently embedding a component in a component carrier is an issue.

SUMMARY

There may be a need to efficiently embed a component in a component carrier.

According to an exemplary embodiment of the invention, a method of manufacturing a component carrier is provided, wherein the method comprises providing a base structure having a front side and a back side, the back side being at least partially covered by a metallic layer, removing material of the base structure from the front side to thereby form a cavity which is at least partially closed by the metallic layer, and inserting a component in the cavity and placing the component on the metallic layer.

According to another exemplary embodiment of the invention, a component carrier is provided, wherein the component carrier comprises a base structure having a front side and a back side and a cavity extending from the front side to the back side, a metallic layer on the back side of the base structure, and a component in the cavity, wherein a lower main surface of the component is substantially at the same vertical level as an upper main surface of the metallic layer.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

According to an exemplary embodiment of the invention, a component is accommodated in a cavity of a base structure which is fully or partly closed with a metallic layer at least during a part of the manufacturing process. At least part of the metallic layer may remain part of the manufactured component carrier, i.e. the final product. By taking this measure, it becomes dispensable to use a temporary carrier such as a sticky tape for closing the cavity and for attaching the component thereto by adhesive. As a result, a simple manufacturing procedure may be obtained which generates less waste, since at least part of the metallic layer may form part of the readily manufactured component carrier. It has surprisingly turned out possible to temporarily loosely place the component in the cavity, i.e. to not adhere it, without compromising on the handling of the component in the cavity during the manufacturing procedure. The process is also simple due to the fact that no remaining adhesive needs to be removed from the component.

According to an exemplary embodiment of the invention, a component carrier can be provided with an embedded component (such as a semiconductor chip) without any need of a consumable sticky tape. According to an embodiment, this may be achieved by placing the component directly on an exposed metallic layer (such as a copper layer) on a base structure (such as a preconditioned core). A conventionally executed process chain (i.e. tape lamination, exposure of tape, soft-lamination, tape removal) is then not needed anymore, and a lay-up and final pressing (for instance for High-Tg-material) may follow directly after assembly of components. Hence, a resource-saving procedure in terms of the dispensable consumable sticky tape is made possible. Moreover, the process chain for embedding of components, in particular with double sided pad termination, may be significantly simplified. The process chain may be made more efficiently by phasing out the processes of tape lamination, exposure of tape, soft-lamination and tape removal. Optionally, the obtained stack up may be pressed with electrically conductive and/or electrically insulating material, corresponding equipment and press profile.

In the following, further exemplary embodiments of the method and the component carrier will be explained.

In an embodiment, inserting the component in the cavity is carried out without adhering the component, in particular without adhesive material between the component and the metallic layer. As a result, the component may be arranged directly on the metallic layer without adhesive material in between. In such an embodiment, the component may be simply placed in the cavity without adhering the component to the metallic layer by adhesive material. This renders the manufacturing process simple and quick, since the process of providing an adhesive material may be simply omitted. It has turned out as sufficient to place the component in the cavity, preferably with sufficiently small gaps between sidewalls of the base structure and the component. In particular, embodiments of the invention have the advantage that no adhesive residues remain at the component, as it may occur in conventional procedures using a sticky tape as temporary carrier. In the latter process, rests of the adhesive material remain at the component, which then need to be removed to a sufficiently large extent. Hence, according to an exemplary embodiment, no adhesive is used for temporarily attaching the component to a surface of the metallic layer closing the cavity in the base structure so that a very simple procedure can be achieved. Furthermore, undesired tilting of the component in the cavity due to uneven adhesive material at the bottom of the cavity may be prevented when no adhesive is provided at all in the cavity at the time of inserting the component in the cavity.

Alternatively, the metallic layer may be covered with an adhesive layer at least in the cavity, or liquid adhesive may be dispensed in the cavity to place the component thereon.

In an embodiment, inserting the component in the cavity is carried out by establishing a direct physical contact between the component and the metallic layer. In other words, no further physical element may be in between the component and the metallic layer closing the bottom of the cavity. Thus, a very simple and compact structure may be used. Furthermore, it may be possible to close the bottom of the cavity by the metallic layer only, i.e. with no further element below. Thus, the carrier of the component forming part of the readily manufactured component carrier may consist of the metallic layer only, for instance a single copper foil.

In an embodiment, the method comprises attaching the metallic layer to the back side of the base structure so that the cavity is completely closed by the metallic layer. Thus, the metallic layer may extend over the entire width of the cavity so that the cavity is entirely closed at its bottom by the metallic layer only. For this purpose, a continuous or complete metallic layer may be attached to the base structure, or a metallic layer having recesses and/or through-holes only in portions at which the metallic layer is attached to a solid region of the base structure apart from the one or more cavities.

In an embodiment, the method comprises removing at least part of the metallic layer after inserting the component in the cavity so that at least part of the surface of the component on the back side of the base structure is exposed. Preferably, this material removal may be carried out only after laminating layer structures to the base structure with the component in the cavity. When the cavity is completely closed by the metallic layer at the time of inserting the component in the cavity, it may be later advantageous to remove part of the metallic layer from the bottom of the cavity, for instance for exposing a surface portion of the component with regard to an environment. The latter may be advantageous, for example for later contacting pads of a semiconductor chip as component which pads are positioned at the back side of the base structure and need be accessible for contacting purposes.

In another embodiment, the method comprises attaching the metallic layer with a through-hole to the back side of the base structure so that the through-hole is located below the cavity. According to such an alternative embodiment, a recess of the metallic layer may be formed at a position where the metallic layer is attached to the base structure in the region of the cavity. When attaching a patterned metallic layer to the surface of the base structure prior to inserting the component in the cavity, such a patterned metallic layer only partially closing the bottom of the cavity has turned out to be still able to sufficiently support the component. At the same time, such an architecture renders it dispensable to later expose a pad or another surface portion of the component at the back side of the base structure, for instance for contacting the latter with an electrically conductive structure.

In an embodiment, the method comprises forming the cavity in the base structure by laser drilling. In particular, the metallic layer may serve as a stop layer for a laser beam during forming the cavity in the base structure. It has turned out that forming the cavity by irradiating the front side of the base structure with a laser beam is a very simple possibility of forming a precisely definable cavity in the base structure. During this procedure, the metallic layer attached to the back side of the base structure can serve as a stop layer on which the material removal of the laser stops.

In an embodiment, the method comprises attaching a further metallic layer to the front side of the base structure, wherein the further metallic layer is patterned so as to form a window in the further metallic layer through which a laser beam propagates during the laser drilling for forming the cavity. It has turned out to be advantageous to attach a further metallic layer to the front side and to pattern the latter (or to provide the metallic layer as patterned already at the point of time of attaching it to the front side of the base structure) to thereby precisely define a window through which the material of the base structure is removed by the laser beam. Descriptively speaking, material of the base structure being exposed by the window formed in the further metallic layer can be easily removed by the laser beam. The shape and dimension of the cavity may therefore be defined in a specifically accurate way. The requirements concerning laser alignment are very small in such an embodiment.

Additionally, or alternatively, forming the cavity in the base structure comprises mechanically removing base structure material, chemically removing base structure material and/or removing base structure material by plasma treatment. Thus, apart from laser processing, many other possibilities for cavity formation can be carried out. Mechanically removing base structure material can for instance be accomplished by mechanically drilling or milling through the material of the base structure. This can be accomplished before or after attaching the metallic layer to the back side of the base structure. A chemical method of removing base structure material is for instance etching which may be rendered selective by applying an etching mask to the base structure prior to supplying an etchant. Also a plasma treatment is capable of efficiently removing base structure material such as fully cured FR4 material.

In an embodiment, the base structure comprises or consists of fully cured electrically insulating material, in particular FR4, at the time of forming the cavity. In particular, the base structure may be a core, more particularly comprising or consisting of a fully cured material. It is therefore possible to use a simple core as a basis for manufacturing the component carrier. Such core material may be made of fully cured resin (in particular epoxy resin), optionally filled with reinforcing particles such as glass fibres. Both material removal (preferably by laser processing) as well as attachment of a metallic layer can be done in a simple way using such a base structure.

In an embodiment, the metallic layer is copper foil. For example, such a copper foil may be simply laminated on the back side of the base structure, i.e. by the application of heat and/or mechanical pressure. The copper foil may have a thickness, which may for instance be in a range between 3 µm and 200 µm, in particular in a range between 10 µm and 100 µm. Alternatively, the copper foil may also be connected to the back side of the base structure by applying an adhesive in between.

In an embodiment, at least part of the metallic layer remains part of the readily manufactured component carrier. Thus, the metallic layer may not serve as a temporary carrier only (such as a sticky foil which is conventionally removed before finalizing manufacture of the component carrier), but at least a part of the metallic layer may form part of the readily manufactured component carrier. Thus, the metallic layer may not only serve as a support for the component to be embedded, but can also contribute to the electric connection circuitry and the mechanical and thermal integrity of the component carrier manufactured.

In an embodiment, the method further comprises connecting at least one electrically insulating layer structure and/or at least one electrically conductive layer structure to at least one of the front side and the back side of the base structure, in particular by laminating. Thus, a further build-up of the component carrier may be formed on one or both opposing main surfaces of the recessed base structure with a component and a metallic layer on the back side. Such a build-up may be formed symmetrically or asymmetrically. The connection of such further layer structures to the mentioned subassembly can be carried out by the application of pressure and/or heat, i.e. by lamination. For that purpose, it may be advantageous that at least one of the electrically insulating layer structures to be connected to one or both opposing main surfaces of the component carrier being manufactured comprises an at least partially uncured material. In the context of the present application, the term "at least partially uncured material" particularly denotes material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the curable or at least partially uncured material, followed by an irreversible hardening upon releasing the applied high pressure and/or high temperature. In particular, the "at least partially uncured material" may comprise or consist of B-stage material and/or A-stage material. By providing the layer structure from resin, prepreg or any other B-stage material, the layer structure may re-melt during lamination so that resin (or the like) may flow for interconnecting the various elements and for closing gaps or voids and may therefore contribute to a stable intrinsic interconnection within the component carrier under manufacture.

In an embodiment, connecting the at least one electrically insulating layer structure by laminating is carried out so that a gap between the component and sidewalls of the cavity is at least partially filled with material of the at least one electrically insulating layer structure. When connecting the mentioned layer structures by lamination, the lamination procedure may temporarily melt resin of such at least partially uncured material (for in-stance resin or prepreg), so that this temporarily liquefied resin not only contributes to the connection of the layer structures to the core with metallic layer and component, but also flows in gaps between the recessed base structure and the component to thereby fill these gaps and adhere the component(s) in place.

In an embodiment, connecting the at least one electrically insulating layer structure by laminating adheres the component in the cavity. In particular, the component may be fixed in place in the cavity not before the laminating procedure.

In an embodiment, the method comprises forming at least one electrically conductive through-connection extending towards the component on the back side of the base structure to thereby establish an external electric connection of the component. In an embodiment, such an electrically conductive through-connection may be a via filled with an electrically conductive material such as copper. For instance, such a via may be formed by laser drilling or mechanical drilling and filling of electrically conductive material in a via can be accomplished by plating. Thus, it is possible to contact the component from a front side and/or from a back side after embedding.

In an embodiment, the method comprises at least partially removing electric charge carriers on the component inserted in the cavity before connecting the at least one electrically insulating layer structure and/or electrically conductive layer structure to the front side of the base structure. It has turned out that, when the component is placed in the cavity without adhesive material therein, it may happen during further handling the component carrier under manufacture that electric charge carriers on the component undesirably lift the small components (for instance semiconductor chips having a thickness of less than 400 µm) out of the cavities. This would disturb the process of embedded the component in the component carrier. It has turned out that when such electric charge is removed at least partially from the components placed in the respective cavity, undesired lifting of the components out of the cavities (for instance upon attaching a prepreg layer during further build-up) can be efficiently prevented.

In an embodiment, the component is located loosely in the cavity before connecting the at least one electrically insulating layer structure and/or electrically conductive layer structure to the front side of the base structure. Loosely placing the component in the cavity without adhesive has turned out as sufficient for handling a panel with components in cavities without significant risk that the components fall out of the cavities. In particular when a discharging procedure is carried out, such an undesired effect may be safely prevented. Not adhering the components in the respective cavity significantly simplifies the process.

In an embodiment, a dimension of the cavity and a dimension of the component are adapted so that a gap between the component and a sidewall of the cavity is less than 150 µm, in particular less than 100 µm. On the one hand, the gap should not become too large to reduce the risk that components undesirably fall out of the cavities during handling of a panel or another preform of a component carrier, and to obtain positional accuracy. On the other hand, a certain gap size is desired in order to enable adhesive or liquefied lamination resin to flow into the cavities during lamination and to fix the components in place at this stage of the manufacturing process. If the gap becomes too small, it is difficult to force resin to flow into such a gap. Furthermore, a pick-and-place process of mounting the components in the cavities may be simplified in terms of tolerances when there is a certain difference between the size of the component and the size of the cavity. The mentioned considerations have resulted in the concept that advantageous properties can be obtained when the gap size is selected in the described range.

In an embodiment, the method comprises adapting a dimension of the cavity and a dimension of the component so that a ratio between a gap size between the component and a sidewall of the cavity on the one hand and a thickness of the component is less than 35%. It has been found that an optimum gap size between component and base structure depends on the thickness or height (rather than on the width) of the components. For instance, tiny semiconductor chips having a dimension of 210 µm may be placed in the cavity, and then the dimension of the gap is advantageously not more than 70 µm.

In an embodiment, the component is inserted in the cavity so that a pad of the component is located on the front side of the base structure. Additionally, or alternatively, the component may be inserted in the cavity so that a pad of the component is located on the back side of the base structure. Thus, the component may be inserted face up into the cavity so that it is even possible to contact such a semiconductor chip or other component from the front side of the base structure without the need to expose a back side of the component. The component may also be mounted face down, or with double sided pads.

In an embodiment of the component carrier, the metallic layer closes at least part of a bottom of the cavity. Thus, even in the completely manufactured component carrier, the metallic layer may still have a supporting function for the component in the cavity.

In an embodiment, the component is adhered within the component carrier exclusively on its side walls and on its top wall, in particular is adhered exclusively by adhesive material of an electrically insulating layer structure connected to the component and to the front side of the base structure, preferably by lamination. Thus, no separate procedure of adhering the component in the cavity needs to be carried out, in contrast to this the adhesion of the component in the cavity can be accomplished merely by a lamination procedure during a buildup of a layer stack on top of the base structure and the component.

In an embodiment, the method comprises manufacturing a plurality of component carriers simultaneously on panel level. In other words, multiple cavities may be formed in a single base structure and may be closed at least partially by a common metallic layer. Multiple components may be assembled in the cavities, in particular one component per cavity. Lamination by one or more layer structures, as described above, may be carried out for all components simultaneously. The method may further comprise singularizing an obtained structure into a plurality of separate component carriers, each comprising a portion of the component carrier material (which may be composed of the base structure and the layer structures), and at least one of the components in a respective cavity. After a common manufacturing of multiple component carriers on a batch or panel level, separation may be accomplished, for example by sawing, laser cutting, or etching.

For example, a dimension of the component may be in a range from $2 \times 2$ mm$^2$ to $8 \times 8$ mm$^2$, in particular may be $4 \times 6$ mm$^2$.

In an embodiment, the manufactured component carrier may be used as a starter generator for an automotive application.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. One or more components may be surface mounted on the component carrier and/or may be embedded in an interior thereof. Moreover, also other than the mentioned components may be used as a component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, dielectric material of the base structure and/or at least one further electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, electrically conductive material of the metallic layer and/or at least one further electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

In an embodiment, the method comprises at least partially removing electric charge carriers from the component before and/or after inserting the component in the cavity. This may provide the advantage that the discharging of the component can be performed in a flexible manner. Hence, removing the electric charge carriers may be done before the component is placed into the cavity and/or when the component has already been placed into the cavity. By removing the electric charge carriers, the component may be placed in the cavity (and embedded therein) very efficiently, because no undesired lifting of the component out of the cavity may occur and the component may remain surprisingly stable on the metallic layer without the component being fixed by an (at least partially) surrounding material (e.g., an adhesive). In this embodiment, the "surrounding material"-free (in particular adhesive-free) manner of placing the component into the cavity (and onto the metallic layer) may function especially efficiently and robustly. Furthermore, it has turned out that, when such electric charge is removed at least partially from the component(s) placed in the respective cavity, undesired lifting of the components out of the cavities during further handling steps, such as upon attaching an electrically insulating layer structure (e.g. a prepreg layer) or an electrically conductive layer structure during further build-up, can be efficiently prevented.

The aspects defined above and further aspects of the invention are apparent from the examples of embodiment to be described hereinafter and are explained with reference to these examples of embodiment.

BRIEF DESCRIPTION OF THE DRAWINGS

FIG. 1, FIG. 2, FIG. 3, FIG. 4, FIG. 5, and FIG. 6 illustrate cross-sectional views of structures obtained while performing a method of manufacturing a component carrier with an embedded component, shown in FIG. 7, according to an exemplary embodiment of the invention.

FIG. 8 and FIG. 9 illustrate cross-sectional views of structures obtained while performing methods of manufacturing a component carrier with an embedded component according to other exemplary embodiments of the invention.

DETAILED DESCRIPTION OF ILLUSTRATED EMBODIMENTS

Figure 1:
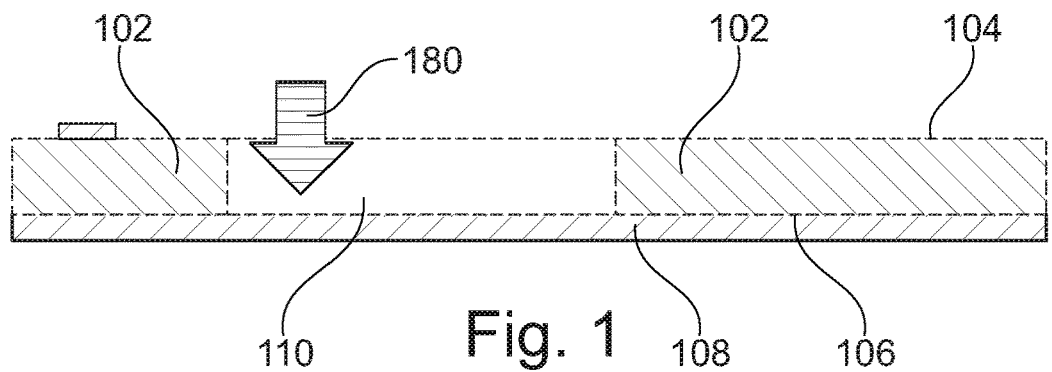

The illustrations in the drawings are schematically presented. In different drawings, similar or identical elements are provided with the same reference signs.

Before, referring to the drawings which illustrate exemplary embodiments that will be described in further detail, some basic considerations will be summarized, based on which exemplary embodiments of the invention have been developed.

According to an exemplary embodiment of the invention, embedding of a component in a component carrier may be accomplished without sticky tape being conventionally used as temporary carrier. According to such an embodiment, the component may be placed very accurately into a cavity, which may be formed with a laser or the like from a top or front side into a base structure (such as a core) in which a metallic layer (for example a copper layer) on the bottom or back side of the base structure is closed. In view of the mentioned metallic layer, no sticky tape is needed to close the cavity for the described assembly and a possible subsequent lamination process.

An exemplary embodiment of the invention avoids the usage of a sticky tape for the embedding process together with its dedicated processes chain (in particular tape lamination—exposure of tape—soft-lamination—tape removal) and saves the resources and processing time of this consumable for high throughput manufacturing.

According to an exemplary embodiment, the following processes may be carried out:

1. A base structure (for instance a core with 18 μm copper on its backside) is preconditioned with a conformal mask only on the top or front side;

2. A cavity is formed, preferably with a laser which stops on an inner metallic layer (for instance the copper layer) of the bottom or back side of the base structure;

3. A cleaning process may be carried out with the cavity of the base structure (for instance a chemical desmear procedure);

4. One or more components may be assembled into the cavity, for instance face up (i.e. with one or more pads oriented towards the front side), face down (i.e. with one or more pads oriented towards the back side) or with pads on both opposing main surfaces of the component;

5. At least one electrically conductive layer structure (for example a copper foil) and/or at least one electrically insulating layer structure (for example a layer comprising at least partially uncured resin and optionally reinforcing particles such as glass fibers, for instance prepreg) may be applied on the top or front side; and 6. A (for instance final) connection procedure may be carried out, for instance by lamination (in particular by pressing, optionally accompanied by heat).

The component may be placed with high accuracy into the cavity, which may be formed with a laser from top side into a base structure (like a core) in which a metallic (preferably copper) layer on the bottom side of the base structure is closed. Therefore, no sticky tape is needed to close the cavity for the assembly and lamination process.

Advantageously, the process time for cavity formation with a laser may be very short (for example, formation of 144 cavities with dimensions of 6.5×4.8 mm$^2$ may be carried out in less than 20 minutes) and with a high accuracy of component position in the cavity. Although the transport of the base structure with the component loosely positioned in the cavities to a lamination device may cause vibration, carrying out the procedure showed that the respective component does not have a pronounced tendency to move out of the respective cavity before lamination. If desired, this tendency may be advantageously further reduced by charge removal of electric charge carriers of the component before applying a prepreg layer from above to which, under undesired circumstances, the component might otherwise adhere by electrostatic forces.

Applications of example embodiments of the invention include the formation of a component carrier to be used as a starter generator or as an electronic power steering, among others.

FIG. 1 to FIG. 7 illustrate cross-sectional views of structures obtained while manufacturing a component carrier 100 (see FIG. 7) with an embedded component 112 according to an exemplary embodiment of the invention.

Referring to FIG. 1, a planar layer-type base structure 102 is shown which has a front side 104 and a back side 106. The back side 106 is fully covered by a metallic layer 108. In the illustrated embodiment, the metallic layer 108 is a continuous copper foil. The base structure 102 is a fully cured core made of FR4 material, i.e. cured epoxy resin with reinforcing glass fibers. The base structure 102 is processed by a laser beam 180 removing dielectric material of base structure 102 from the front side 104 thereof to thereby form a cavity 110 which is closed at the bottom or back side 106 by the metallic layer 108. In other words, the metallic layer 108 has been attached to the back side 106 of the base structure 102 prior to the laser processing. Since the laser beam 180 is configured to not extend through the metallic layer 108, the cavity 110 remains completely closed by the metallic layer 108 after laser drilling. Hence, the metallic layer 108 serves as a stop layer for the laser beam 180 during formation of the cavity 110 in the base structure 102. The metallic layer 108 functions, as will be described below referring to FIG. 2 and FIG. 3, as a carrier for a component 112 to be placed in the cavity 110 and remains—contrary to a conventionally used temporary carrier such as a sticky tape—part of the readily manufactured component carrier 100 shown in FIG. 7.

FIG. 1 therefore shows that the metallic layer 108, configured as copper foil, has been laminated to the back side 106 of the core-type base structure 102. Preferably, after laminating the metallic layer 108 to the back side 106, the through-hole type cavity 110 is formed by laser cutting in the base structure 102. During this procedure, the metallic layer 108 serves as stop layer, i.e. as structure where the material removal triggered by the laser beam 150 stops.

Figure 2:
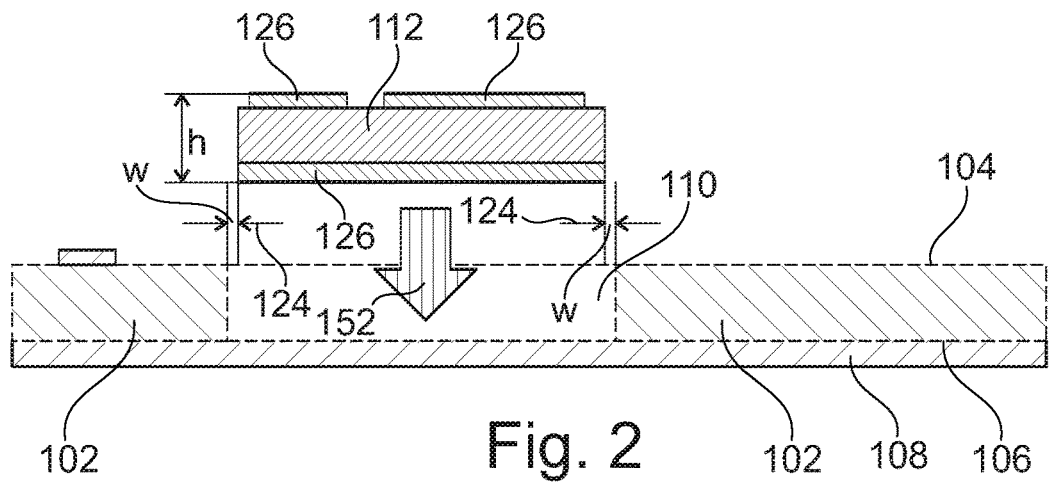

Referring to FIG. 2, a component 112 (such as a semiconductor chip or naked die) is inserted in the cavity 110 and is placed on the metallic layer 108. Preferably, inserting the component 112 in the cavity 110 may be carried out without adhering the component 112 to the metallic layer 108, i.e. without adhesive material between the component 112 and the metallic layer 108. By inserting the component 112 in the cavity 110, a direct physical contact may be established between the component 112 and the metallic layer 108. As a result of this procedure, the component 112 is accommodated loosely in the cavity 110.

A dimension of the cavity 110 and a dimension of the component 112 may be adapted to one another so that a size, w, of gap 124 between the component 112 and a sidewall of the cavity 110 is preferably less than 100 μm, for example 70 μm. More specifically, the entire width of the cavity 110 and the height, h, of the component 112 may be adjusted so that a ratio between gap width w between the component 112 and a respective sidewall of the cavity 110 on the one hand and the height h or vertical thickness of the component 112 on the other hand is less than 35%. For instance, the height h of the component 112 may be 210 μm and a size of the gap 124 may be 70 μm.

As shown, the component 112 is inserted in the cavity 110 so that two electrically conductive pads 126 of the semiconductor component 112 are located on the front side 104 of the base structure 102 and one electrically conductive pad 126 of the semiconductor component 112 is located on the back side 106 of the base structure 102.

Arrow 152 in FIG. 2 indicates a motion direction during placement of the component 112 in the cavity 110 to loosely position the component 112 in the cavity 110 supported on the bottom side by the continuous metallic layer 108.

Figure 3:
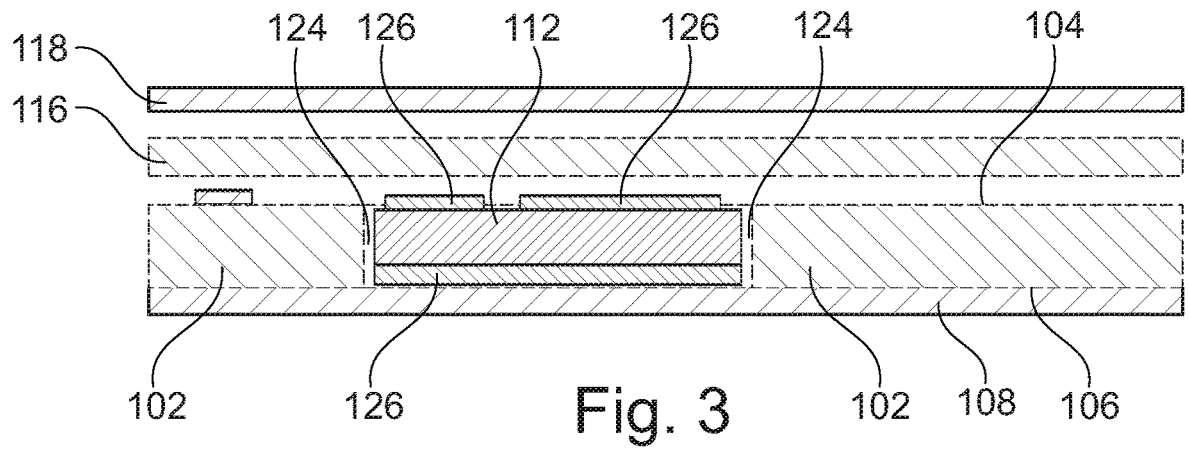

Referring to FIG. 3, a build-up lamination is carried out on top of the assembly shown in FIG. 2. Hence, the method further comprises connecting an electrically insulating layer structure 116 (such as a dielectric layer comprising uncured epoxy resin with reinforcing glass fibers, for instance prepreg) and a further electrically conductive layer structure 118 (such as a further copper foil) to the front side 104 of the base structure 102. The mentioned layer structures 116, 118 may be connected with one another by laminating, i.e. the application of pressure and/or heat. The mentioned laminating procedure may be carried out so that the gaps 124 between the component 112 and sidewalls of the cavity 110 are filled with re-melting and cross-linking material of the uncured electrically insulating layer structure 116. Thereby, the previously loose component 112 is fixed in place in the cavity 110 by the re-melted and cross-linked material of the electrically insulating layer structure 116 which has an adhering function and has now become fully cured. The prepreg sheet made of uncured material serves as an adhesive during subsequent lamination, since its resin is still capable of cross-linking and thereby establishing an adhesive connection between the constituents of the component carrier 100 to be manufactured.

Before lamination, more specifically before attaching electrically insulating layer structure 116 to an upper main surface of component 112 loosely positioned in the cavity 110, it is optionally but advantageously possible to remove electric charge carriers on the component 112 inserted in the cavity 110. By taking this measure, it can be safely prevented that the in many cases electrically charged component 112 is lifted out of the cavity 110 by electrostatic forces adhering the electrically insulating layer structure 116 and the component 112 in an undesired way on one another before lamination.

FIG. 3 therefore illustrates the situation of a further build-up of further electrically conductive layer structure(s) 118 and electrically insulating layer structure(s) 116 on the front side of the assembly. Additionally, or alternatively, such a build-up may be accomplished on the back side of the assembly.

Figure 4:
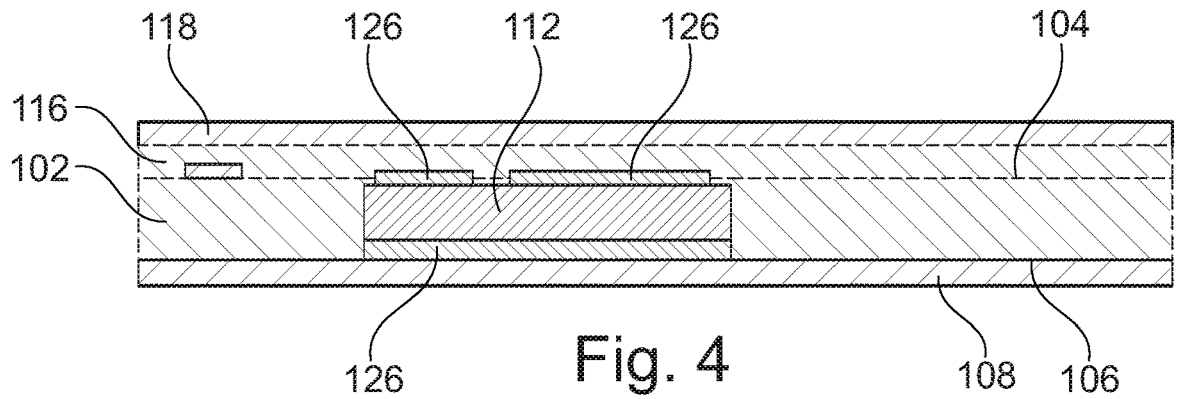

FIG. 4 shows the result obtained after interconnecting the constituents shown in FIG. 3 by lamination, i.e. the application of heat and pressure. The curable material of the electrically insulating layer structure 116 thereby temporarily melts or becomes liquid, flows into gaps 124 between the component 112 and the recessed base structure 102 and finally resolidifies to keep all the constituents together.

Referring to FIG. 5, the metallic layer 108 may be removed selectively in a region corresponding to the cavity 110 after lamination so that at least part of the lower main surface of the component 112 on the back side 106, in particular the pad 126 on the back side 106, of the base structure 102 is exposed. More specifically, FIG. 5 shows the result of a patterning procedure carried out on the back side of the structure shown in FIG. 4, see arrow 193. Thereby, a window 160—aligned with the cavity 110—is formed in the metallic layer 108 to expose the pad 126 on the bottom side of the component 112. On the front side, a patterning procedure (see arrows 191) patterns the electrically conductive layer structure 118. As a result, a pattern of electrically conductive structures 164 is formed on the front side of the structure shown in FIG. 5.

As can be taken from FIG. 6, compare arrows 166, part of the material of the now fully cured electrically insulating layer structure 116 is removed so as to expose the pads 126 of the component 112 on its upper main surface.

In order to obtain the component carrier 100 shown in FIG. 7, both the front side and the back side of the structure of FIG. 6 is covered with electrically conductive material 168 by plating. Inter alia, an electrically conductive through-connection 122 may be formed extending towards the component 112 on the back side 106 of the base structure 102 to thereby complete an external electric connection of the component 112. Preferably, the electrically conductive material 168 comprises or consists of copper. Thereby, the pads 126 of the component 112 are electrically connected to a surface of the component carrier 100 shown in FIG. 7, here embodied as printed circuit board. In the component carrier 100, the lower main surface of the component 112 is free of adhesive material.

FIG. 8 and FIG. 9 illustrate cross-sectional views of structures obtained during performance of methods of manufacturing a component carrier 100 with an embedded component 112 according to other exemplary embodiments of the invention.

According to FIG. 8, a further metallic layer 108' (such as a further copper foil) is attached to the front side 104 of the base structure 102 prior to cavity formation, wherein the further metallic layer 108' is patterned so as to form a window 116 in the further metallic layer 108' through which a laser beam (see reference numeral 180 in FIG. 1) propagates during laser drilling for forming the cavity 110. FIG. 8 shows a semifinished product obtained during manufacturing a component carrier 100 according to an exemplary embodiment of the invention. In order to precisely define the shape, dimension and position of the cavity 110 to be formed, the structure shown in FIG. 8, in addition to the structure shown in FIG. 1, additionally comprises the patterned further metallic layer 108' covering the front side 104 of the base structure 102, to expose window 116. When a laser beam (not shown in FIG. 8) is subsequently irradiated on the upper main surface of the structure shown in FIG. 8, cavity 110 is formed precisely in the region corresponding to the window 116. The metallic layer 108 again serves as stop layer for the laser beam 180.

Referring to FIG. 9, the method comprises the procedure of attaching the metallic layer 108 with a through-hole 114 to the back side 106 of the base structure 102 so that the through-hole 114 is located below the cavity 110. FIG. 9 relates to the scenario according to which the metallic layer 108 attached to the back side 106 of the base structure 102 is already in a patterned state when being attached to the back side 106. Thus, a window or through-hole 114 is provided at the position of the cavity 110 and keeps the latter partially open even prior to inserting the component 112 in the cavity 110. By taking this measure, still sufficient mechanical support is provided by the patterned metallic layer 108 for holding the component 112 in the cavity 110, and at the same time the back side opening patterning procedure shown above in FIG. 5 can be omitted. Hence, the metallic layer 108 closes part of a bottom of the cavity 110 of the readily manufactured component carrier 100. FIG. 9 shows that a pad 126 is arranged at a position corresponding to the through-hole 114 of the metallic layer 108 in the region of the cavity 110. When the component 112 is configured as an embedded MOSFET, the pad 126 at the lower main surface may relate to a drain terminal or may relate to cooling only. The pads 126 on the upper main surface of the component 112 can then be terminals for gate, source and optional drain (for instance in the case of horizontal MOSFETs such as a GaN MOSFET).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principles according to the invention even in the case of fundamentally different embodiments.

The invention claimed is:

1. A method of manufacturing a component carrier being a printed circuit board, an IC substrate or an organic interposer, the method comprising:
providing a base structure having a front side and a back side, the back side being at least partially covered by a metallic layer;
removing material of the base structure from the front side to thereby form a cavity which is at least partially closed by the metallic layer;
inserting a component in the cavity;
placing the component on the metallic layer,
wherein placing the component on the metallic layer in the cavity is carried out by establishing a direct physical contact between substantially a complete back-side of the component and the metallic layer, and
wherein inserting the component in the cavity is carried out without adhering the component to the metallic layer;
carrying out a discharging procedure by charge removal of electric charge carriers; and
at least partially removing the electric charge carriers from the component inserted in the cavity before covering the component in the cavity and before connecting at least one electrically insulating layer structure and/or electrically conductive layer structure to the front side of the base structure.

2. The method according to claim 1, wherein the method further comprises:
attaching the metallic layer to the back side of the base structure before removing material of the base structure so that the cavity is completely closed by the metallic layer.

3. The method according to claim 2, wherein the method further comprises:
removing at least part of the metallic layer after inserting the component in the cavity so that at least part of a surface of the component on the back side of the base structure is exposed.

4. The method according to claim 1, wherein the method further comprises:
attaching the metallic layer with a through-hole to the back side of the base structure before removing material of the base structure so that the through-hole is located below the cavity.

5. The method according to claim 1, wherein the method further comprises:
forming the cavity in the base structure by laser drilling.

6. The method according to claim 5, wherein the laser drilling is adapted so that the metallic layer serves as a stop layer for a laser beam while forming the cavity in the base structure.

7. The method according to claim 5, wherein the method further comprises:
attaching a further metallic layer to the front side of the base structure, wherein the further metallic layer is patterned so as to form a window in the further metallic layer through which a laser beam propagates during the laser drilling for forming the cavity.

8. The method according to claim 1, further comprising at least one of:
forming the cavity in the base structure by one or more of mechanically removing material of the base structure, chemically removing material of the base structure, and removing material of the base structure by plasma treatment;
the base structure comprises a fully cured electrically insulating material when forming the cavity;
the metallic layer is copper foil;
at least part of the metallic layer remains part of the component carrier.

9. The method according to claim 1, wherein the method further comprises:
connecting at least one electrically insulating layer structure and/or at least one electrically conductive layer structure to at least one of the front side and the backside of the base structure by laminating.

10. The method according to claim 9, further comprising at least one of:
connecting the at least one electrically insulating layer structure by laminating is carried out so that a gap between the component and sidewalls of the cavity is at least partially filled with material of the at least one electrically insulating layer structure;
connecting the at least one electrically insulating layer structure by laminating adheres the component in the cavity;
loosely locating the component in the cavity before connecting the at least one electrically insulating layer structure and/or electrically conductive layer structure to the front side of the base structure.

11. The method according to claim 9, further comprising at least one of:
adapting a dimension of the cavity and a dimension of the component so that a gap between the component and a sidewall of the cavity is less than 150 µm;
adapting a dimension of the cavity and a dimension of the component so that a ratio between a size of a gap between the component and a sidewall of the cavity and a thickness of the component is less than 35%;
forming at least one electrically conductive through-connection extending towards the component on the hack side of the base structure to thereby establish an external electric connection of the component;
inserting the component in the cavity so that at least one pad of the component s located on the front side of the base structure;
inserting the component in the cavity so that at least one pad of the component is located on the back side of the base structure;
the base structure is a core comprising a fully cured material;
manufacturing a plurality of component carriers simultaneously on a panel level.

12. The method according to claim 1, wherein the method further comprises:
at least partially removing, electric charge carriers from the component before and/or after inserting the component in the cavity.

* * * * *